United States Patent
Gallinet et al.

(10) Patent No.: US 10,423,124 B2
(45) Date of Patent: Sep. 24, 2019

(54) ATOMIC CLOCK

(71) Applicant: CSEM CENTRE SUISSE D'ELECTRONIQUE ET DE MICROTECHNIQUE SA—RECHERCHE ET DÉVELOPPEMENT, Neuchâtel (CH)

(72) Inventors: Benjamin Gallinet, Muttenz (CH); Jacques Haesler, Lugnorre (CH); Steve Lecomte, Bernex (CH); Guillaume Basset, Huningue (FR)

(73) Assignee: CSEM CENTRE SUISSE D'ELECTRONIQUE ET DE MICROTECHNIQUE SA—RECHERCHE ET DÉVELOPPEMENT, Neuchâtel (CH)

( * ) Notice: Subject to any disclaimer, the term of this patent is extended or adjusted under 35 U.S.C. 154(b) by 122 days.

(21) Appl. No.: 15/325,695

(22) PCT Filed: Oct. 8, 2014

(86) PCT No.: PCT/EP2014/071590
§ 371 (c)(1),
(2) Date: Jan. 11, 2017

(87) PCT Pub. No.: WO2016/008549
PCT Pub. Date: Jan. 21, 2016

(65) Prior Publication Data
US 2017/0146958 A1    May 25, 2017

(30) Foreign Application Priority Data
Jul. 17, 2014    (WO) .................. PCT/EP2014/065456

(51) Int. Cl.
*G04F 5/14* (2006.01)
*G02B 6/124* (2006.01)
(Continued)

(52) U.S. Cl.
CPC ............. *G04F 5/145* (2013.01); *G02B 6/124* (2013.01); *G02B 6/2706* (2013.01); *H03L 7/26* (2013.01);
(Continued)

(58) Field of Classification Search
CPC ........... G04F 5/145; H03L 7/26; G02B 6/124; G02B 6/2706; G02B 2006/12104
(Continued)

(56) References Cited

U.S. PATENT DOCUMENTS

| 2008/0278710 A1* | 11/2008 | Schmidt ............. G01N 21/3103 356/73 |
| 2014/0028405 A1* | 1/2014 | Hong ..................... H03L 7/26 331/94.1 |

FOREIGN PATENT DOCUMENTS

| WO | 03/088472 A2 | 10/2003 |
| WO | 2006/064301 A1 | 6/2006 |

OTHER PUBLICATIONS

International Search Report dated Jun. 23, 2015, issued in corresponding International Application No. PCT/EP2014/071590, filed Oct. 8, 2014, 3 pages.
(Continued)

*Primary Examiner* — Arnold M Kinkead
(74) *Attorney, Agent, or Firm* — Christensen O'Connor Johnson Kindness PLLC

(57) ABSTRACT

In the present invention a new atomic clock is proposed comprising: at least one light source adapted to provide an optical beam, at least one photo detector and a vapor cell comprising a first optical window, said optical beam being directed through said vapor cell for providing an optical frequency reference signal, said photo detector being adapted to detect said optical frequency reference signal and to generate at least one reference signal, wherein—said
(Continued)

atomic clock comprises a first optical waveguide arranged to said first optical window, said first optical waveguide being arranged to incouple at least a portion of said optical beam, said first optical waveguide being sized and shaped so that said first guided light beam is expanded, a first outcoupler is arranged to outcouple at least a portion of said guided light beam to said vapor cell, —the thickness t of the atomic clock is smaller than 15 nm.

32 Claims, 12 Drawing Sheets

(51) Int. Cl.
*G02B 6/27* (2006.01)
*H03L 7/26* (2006.01)
*G02B 6/12* (2006.01)

(52) U.S. Cl.
CPC .............. *G02B 2006/12104* (2013.01); *G02B 2006/12126* (2013.01)

(58) Field of Classification Search
USPC .................................................... 331/3, 94.1
See application file for complete search history.

(56) References Cited

OTHER PUBLICATIONS

Written Opinion of the International Searching Authority dated Jun. 23, 2015, issued in corresponding International Application No. PCT/EP2014/071590, filed Oct. 8, 2014, 6 pages.

\* cited by examiner

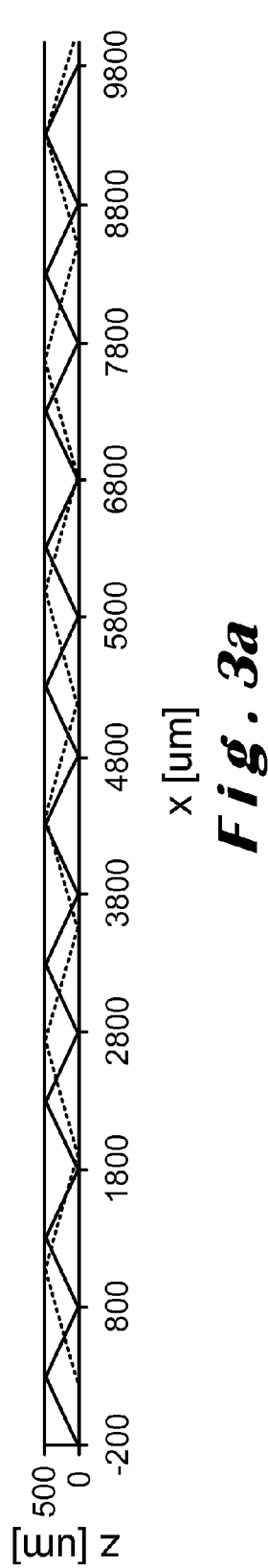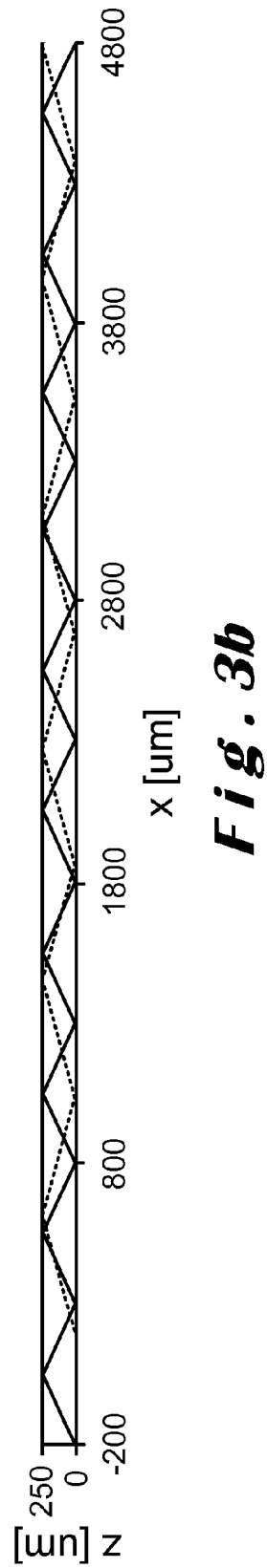

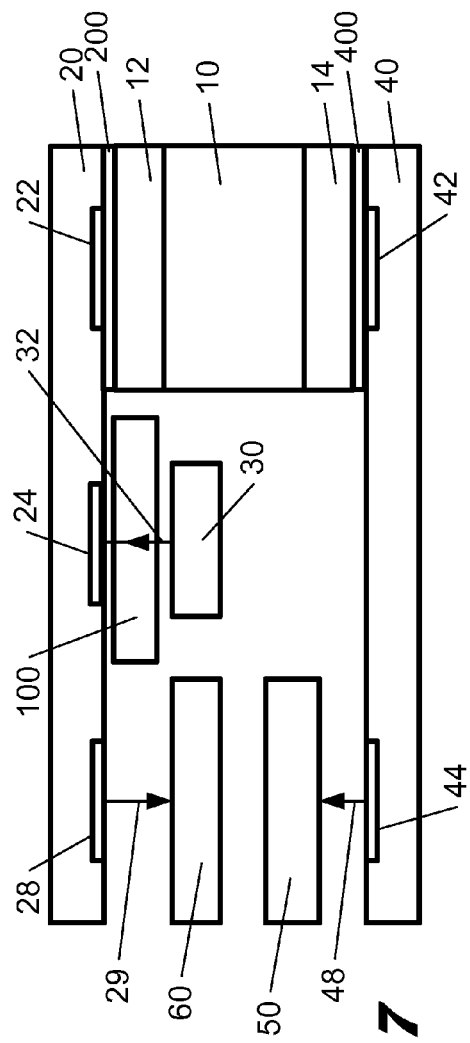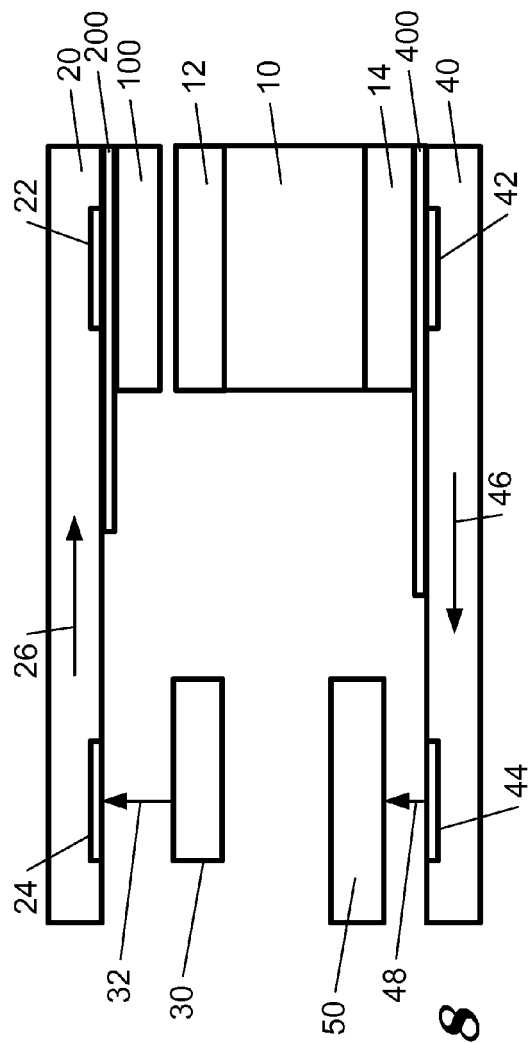

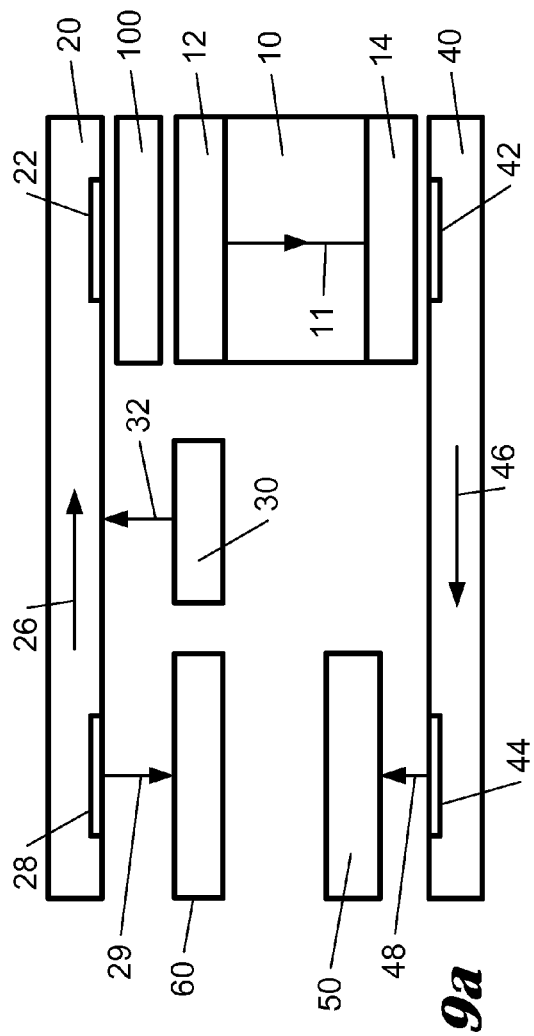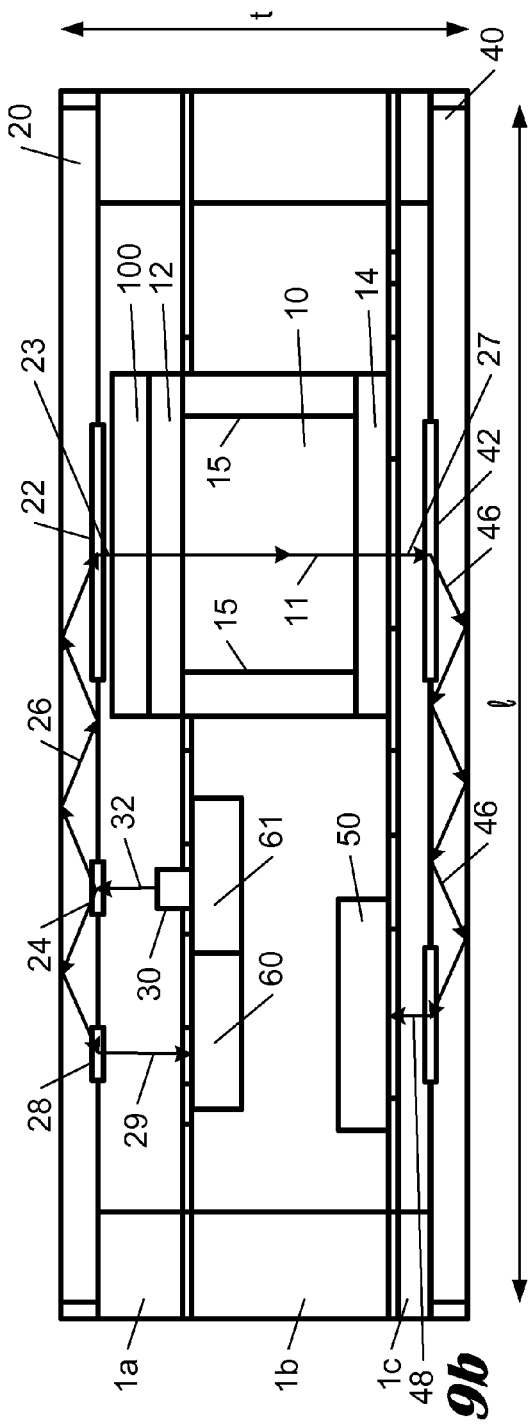

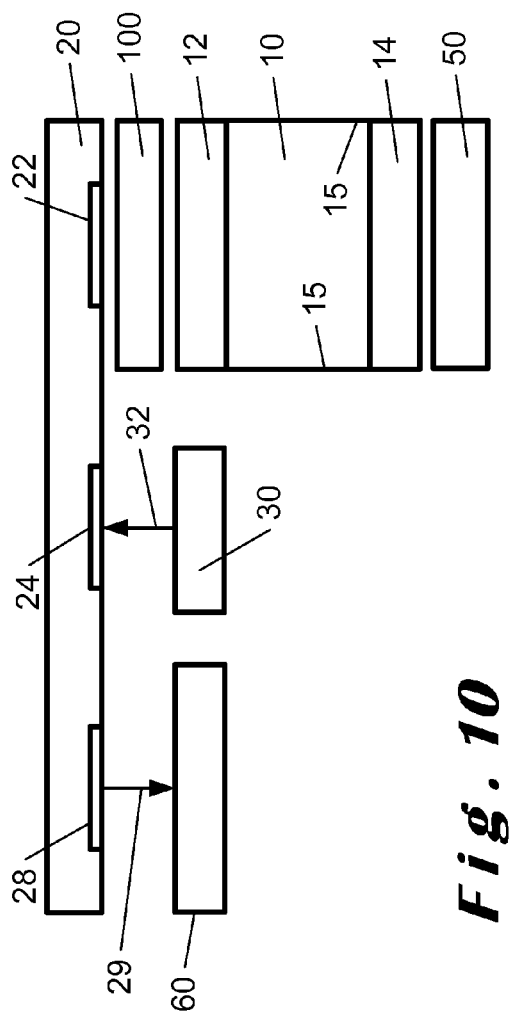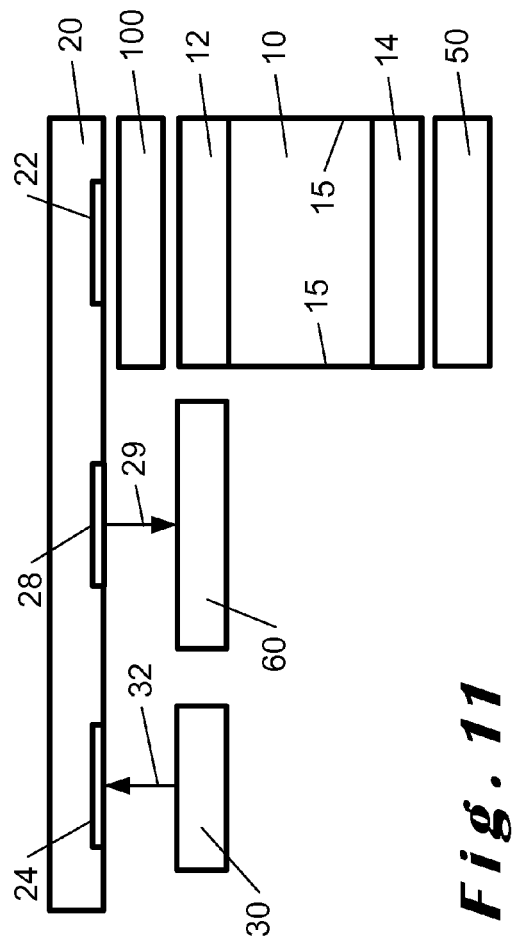

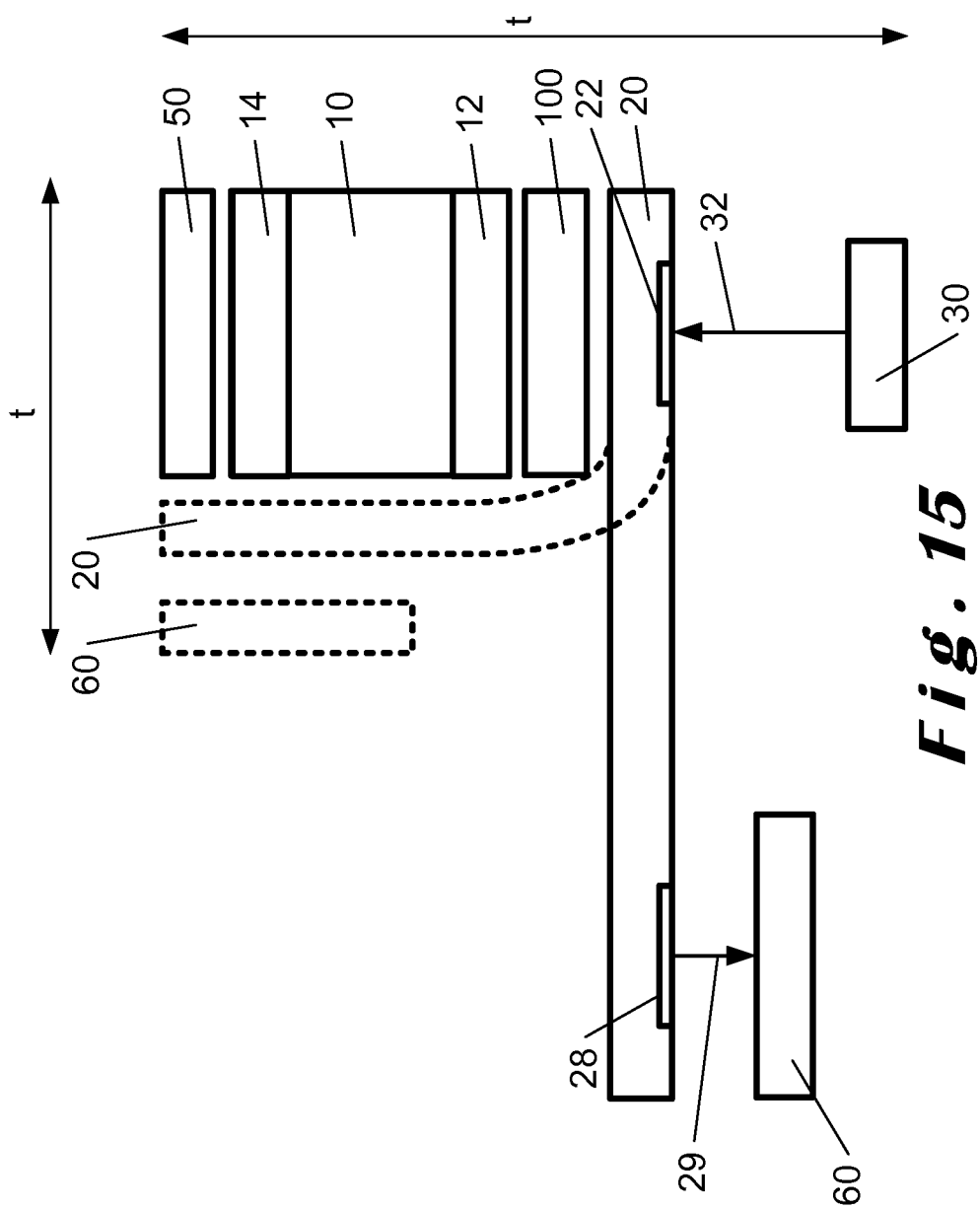

ATOMIC CLOCK

TECHNICAL FIELD

The present invention relates to the field of frequency reference devices and specifically to atomic clocks. More particularly, the present invention relates to miniaturized atomic clocks having a reduced size and that may be integrated in portable systems.

BACKGROUND OF THE INVENTION

Atomic clocks have been developed since more than 50 years, following fundamental scientific progress and developments in the field of quantum mechanics and microwave spectroscopy. Electronic technology and control systems have made huge progress in the field of atomic clocks. They aim mainly to improve the degree of accuracy and also the stability of the frequency signals delivered by the atomic clocks. In recent years different types of atomic clocks have been developed such as the cold atomic fountain clocks. Also, new configurations have been developed to make atomic clocks airborne (airplanes, satellites). In order to achieve miniaturization of atomic clocks the trend has been to use techniques such as double resonance (DR) microwaves or coherent population trapping (CPT). A Rubidium DR miniaturized clock has been described in: V. Venatraman et ak. "Micro fabricated Chip-Scale Rubidium Plasma Light Source for Miniature Atomic Clocks", IEEE Transactions on Ultrasonics, Ferroelectrics and Frequency Control, 59, 3, pp. 448-456, 2012. The described chip-scale miniature clock is based on a stack configuration, having a thickness of typically 1 cm, wherein all the components (light source, gas cell, detector) are piled on top of each other, limiting therefore the possibility to reduce considerably the overall thickness and size of the device.

CPT is a challenging technique to miniaturized atomic clocks. CPT is a nonlinear phenomenon in atoms in which coherences (electromagnetic dipole moments) between atomic energy levels are excited by pairs of optical fields. Atomic clocks based on CPT rely mainly on a vertical cavity surface emitting laser diode (VCSEL) as the light source.

CPT techniques, also called electromagnetically induced transparency techniques, are described in for example: S. Harris "Electromagnetically induced transparency", Physics Today, p. 36-42, 1997, and also discussed in Knappe et al. "Characterization of coherent population-trapping resonances as atomic frequency references"; J. Opt. Soc. Am. B, pp. 1545-1553, 2001), both articles being incorporated herein by reference in their entirety.

In most vapor-cell frequency references, which do not use CPT, the minimum size of the clock physics package is determined in part by the cavity that confines the microwaves used to excite the atoms. Because the cavity has to be a resonant cavity, it is usually larger than half of the wavelength of the microwave radiation used to excite the atomic resonance. For cesium and rubidium vapors for example, this wavelength is typically several centimeters. This size is a fundamental limitation to develop vapor-cell references that would be suited for portable applications. The large gas volume needed for standard vapor-cell frequency references implies also a considerable challenge to maintain the package and the cell at the required temperature. Frequency standards should be useful over a wide range of temperatures. Also, the atomic transition frequency is dependent on the temperature of the vapor-cell, therefore the cell temperature must be controlled to a fixed value and have a great stability. A significant amount of power may be required to maintain the cell at a fixed temperature. This power depends on the cell size and requires several watts for cells having a volume of a cubic centimeter. Therefore there is a huge interest in developing cells with smaller sizes.

The coherent population trapping (CPT) technique does not require a microwave field applied to the gas in the cell and the performance of the atomic clock scales proportional to the size of the vapor cell. Atomic clocks based on CPT techniques may therefore be miniaturized, which also has the benefit of a simpler implementation, and so also leads to cheaper solutions as the CPT gas cells may be realized for example by batch processing. Recent advances in the research and development of CPT clocks have shown that very good stabilities may be obtained. For all the above mentioned aspects, CPT based clocks are a good choice to make miniaturized atomic clocks.

Prior art discloses a number of realizations that aim to reduce the size and especially the thickness of miniaturized DR, CPT or other types of atomic clocks. The document WO 2013/120334A1 for example discloses a miniaturized atomic clock comprising discrete optical elements such as beam splitters, lenses and prisms in order to reduce the overall size of the optical system. The system disclosed in WO 2013/120334A1 requires the alignment and assembly of the different optical components. The cost of such an atomic clock remains quite expensive because of the use of discrete optical components and their assembly. Also, the optical stability of the system is limited and shocks and vibrations may reduce the reliability of the device. The possible reduction in size of the device disclosed in WO 20131120334A1, mainly the reduction in thickness of the system, is basically limited by the use of discrete optical components.

In another approach, the application US 201410014826A1, discloses a vacuum cell for an atomic clock comprising folded optics. In US 201410014826A1 a set of diffractive optics is configured to reflect the optical beam within the enclosed volume of the gas cell of the atomic clock. The system disclosed in US 201410014826A1 requires to be coupled to a light beam having a light beam adapted to the incoupling diffractive optics. It would therefore be difficult to reduce the overall size of the system. Also, discrete components such as lenses or a fiber holder need to be adapted to the cell making the alignment and assembly of a complete miniature clock complicated and expensive.

SUMMARY OF THE INVENTION

An object of the present invention is to propose a new atomic clock to overcome at least partially the limitations of atomic clocks of prior art. This is achieved by an atomic clock of which the size and more precisely the thickness is considerably reduced compared to atomic clock devices of prior art. To this end the invention concerns a miniaturized atomic clock wherein at least one optical waveguide is arranged to the vapor cell of the atomic clock, said optical waveguide being arranged to expand and transport a guided light beam provided by a light source, said optical waveguide providing an expanded light beam to the vapor cell of the atomic clock.

The object of the invention is more precisely achieved by the atomic clock of the invention comprising at least one light source adapted to provide an optical beam, at least one photo detector and a vapor cell comprising a first optical window, said optical beam being directed through said vapor cell for providing an optical frequency reference signal, said photo detector being adapted to detect said optical frequency reference signal and to generate at least one reference signal. The atomic clock further comprises a first optical waveguide arranged to said first optical window, said first optical waveguide may be any waveguide, preferably a substantially flat optical waveguide. The use of an optical waveguide is essential to achieve a total thickness of the atomic clock smaller than 15 mm, preferably smaller than 5 mm Said first optical waveguide comprises an incoupling surface facing said light source and is arranged to incouple at least a portion of said optical beam into said first optical waveguide, said portion providing a first guided light beam propagating into said first optical waveguide, said first optical waveguide being sized and shaped so that said first guided light beam undergoes at least three internal reflections in said first optical waveguide. Expanding the guided light beam by multiple internal reflections in said first optical waveguide allows expanding the guided light beam while keeping the thickness of the atomic clock small. Also, the aperture of the outcoupled light beam may be determined by choosing the geometry of the optical waveguide and the number of internal reflections.

A first outcoupler is facing said first optical window, said first outcoupler provides a first outcoupled light beam transmitted to said vapor cell by said first optical window. Said first incoupling surface and said first outcoupler are separated by a distance D chosen to expand said first guided light beam, providing said first outcoupled light beam. Realizing the beam expansion of the light source by using an incoupling surface and an outcoupler arranged on said first optical waveguide allows miniaturizing the atomic clock.

In an embodiment said first incoupling surface comprises a first incoupling grating. Arranging an incoupling grating to said first incoupling surface allows achieving high incoupling efficiencies.

In another embodiment said vapor cell comprises a second optical window facing said first optical window and a second optical waveguide is arranged to said second optical window, said second optical waveguide comprising a second incoupler and a second outcoupling surface, and a photo detector is arranged to said second outcoupling surface. All embodiments of the invention that use a first optical waveguide and a second optical waveguide are preferred solutions to achieve a compact atomic cell and thicknesses as small as 2.5 mm may be achieved.

In another embodiment said first optical waveguide comprises a second outcoupling surface, facing a reference detector. In a variant said reference detector is arranged to said first optical waveguide, between said t light source and said first outcoupling grating. Arranging a reference detector at different places in the length of said first optical waveguide allows to provide different design variants. In a variant at least two reference detectors cooperating with a corresponding outcoupling surface of said first optical waveguide may be arranged in the atomic cell.

In an embodiment a photo detector is arranged to said second optical window and in a variant of this embodiment a reference detector is arranged to said first optical waveguide and said reference detector may be arranged to said first optical waveguide between said light source and said first outcoupling grating. Arranging a photo detector to said second optical window allows to achieve a balance between compactness of the atomic cell and the technological complexity when using an inorganic photo detector. In addition, emerging organic photo detectors such as organic photodiodes exhibits remarkable efficiency and very high compactness. It is well known than external quantum efficiency above 80% can be achieved using organic active layers having thicknesses typically of a hundred to a few hundreds nanometers. Many highly efficient photo detectors were demonstrated having a total thickness, including the electrode pair, thinner than a micron. Such advanced technologies to realize photo detectors as well as other emerging photo detector technologies could prove suitable to be arranged to said second optical window, while being extremely compact.

In an embodiment light is outcoupled by one of the edges of said first optical waveguide and a first outcoupling grating is arranged to that edge. In a variant wherein light is outcoupled by a first edge of the first optical waveguide, a collimating optical system is arranged to said first optical window. Said collimating optical system may be a collimating diffraction grating. Coupling light out of an edge of the first optical waveguide allows to realize different design variants to configure the atomic cell so that it has a small thickness. The light source may be incoupled by a second edge of the first optical waveguide. In a variant of a configuration in which light is outcoupled by the edge of the first optical waveguide, said vapor cell comprises at least one reflecting surface arranged to the wall of said vapor cell. Using reflecting wall surfaces for visible and/or near-infrared light inside the vapor cell allows to improve the interaction of the light beam with the gas inside the vapor cell.

In an embodiment said light source comprises a quarter-wave plate facing said first incoupling surface. This allows to incouple and guide circular polarized light in said first optical waveguide. For clarity, a quarter-wave plate is considered as an optical device suitable for polarization rotation, such as a birefringent material retarding plate. Other optical polarization rotators, such as gratings, may be used as well in a quarter-wave plate configuration.

In another variant a quarter-wave plate is arranged between said first outcoupling grating and said first optical window. This arrangement avoids the requirement of the conservation of the circular polarized state of the guided light beam and allows to incouple and guide linear polarized light in said first optical waveguide.

In an embodiment a mirror is arranged to said second optical window and a quarter wave plate is arranged between said first outcoupling grating and said first optical window, and a second optical waveguide is arranged to said first optical waveguide, said second optical waveguide comprising a first incoupling grating facing said first outcoupling grating, said second optical waveguide also comprising a second outcoupling surface, and a photo detector is arranged to said second outcoupling surface. In a variant a reference detector is arranged to a second outcoupling surface of said second optical waveguide. In another variant said reference detector is arranged between said light source and said first outcoupling grating.

Using a mirror arranged to said second optical window allows to double the path length of the optical beam inside the vapor cell and so to improve the signal-to-noise ratio. This arrangement allows also to couple the reflected optical beam through the first optical waveguide and to direct it to a second optical waveguide to which a photo detector is arranged, or direct it directly to a photo detector.

In an embodiment said first optical window or said second optical window is an aperture. In another embodiment said first optical window or said second optical window is made of a transparent material. In case said first or said second optical window is an aperture, the sealing of the vapor cell may be realized by said first respectively second optical waveguide that may comprise an appropriate layer adapted to realize said sealing.

In an embodiment said first optical waveguide and/or said second optical waveguide comprises an adaptation layer. An adaptation layer may improve the assembly and sealing of the optical waveguides with the vapor cell.

In an embodiment said first optical waveguide or said second optical waveguide comprises at least one metalized surface. Using at least one metalized surface on said optical waveguides allows to improve the transmission characteristics of the optical waveguides, for example if the incidence angle on the surfaces of the optical waveguides is higher than the critical reflection angle.

In an embodiment said first outcoupling grating and/or said second incoupling grating is a nanostructured grating comprising an asymmetric coating.

In all embodiments of the invention said optical waveguides may comprise a cladding. In an embodiment said first optical waveguide or said second optical waveguide comprises a cladding layer on the whole waveguide surface, on some of its faces or on a part of some of its faces. Such cladding can prevent dust or mechanical vibration to alter the different light beams transported in the said first optical waveguide or said second optical waveguide and as such to improve the robustness and stability of the vacuum cell, or to improve its efficiency by preventing light to leak out of the optical waveguides at possible optical contact points. In an embodiment said first optical waveguide or said second optical waveguide may comprise an absorption layer, said absorption layer covering a portion of at least one of the surfaces of the first and/or second optical waveguides. Said absorption layer may reduce stray light preventing unwanted light going in the vapor cell or reaching one of the photodetectors and may improve the signal to noise ratio of the signals delivered by the atomic cell.

BRIEF DESCRIPTION OF THE DRAWINGS

FIG. 3 illustrates the expansion of a light beam in a first optical waveguide;
FIG. 7 illustrates an atomic clock comprising a first waveguide comprising a photo detector and a second waveguide comprising a reference detector
FIG. 8 illustrates an atomic clock comprising a quarter-wave plate arranged between a first optical waveguide and a vapor cell;
FIG. 9a illustrates another atomic clock comprising a quarter-wave plate arranged between a first optical waveguide and a vapor cell;
FIG. 9b illustrates an exemplary realization of an atomic clock of FIG. 9a comprising a quarter-wave plate arranged between a first optical waveguide and a vapor cell;
FIG. 10 illustrates an atomic clock comprising a photo detector arranged to a second optical window of the vapor cell;
FIG. 11 illustrates another atomic clock comprising a photo detector arranged to a second optical window of the vapor cell;
FIG. 15 illustrates another atomic clock comprising a laser that faces the vapor cell.

DETAILED DESCRIPTION

Figure 1:
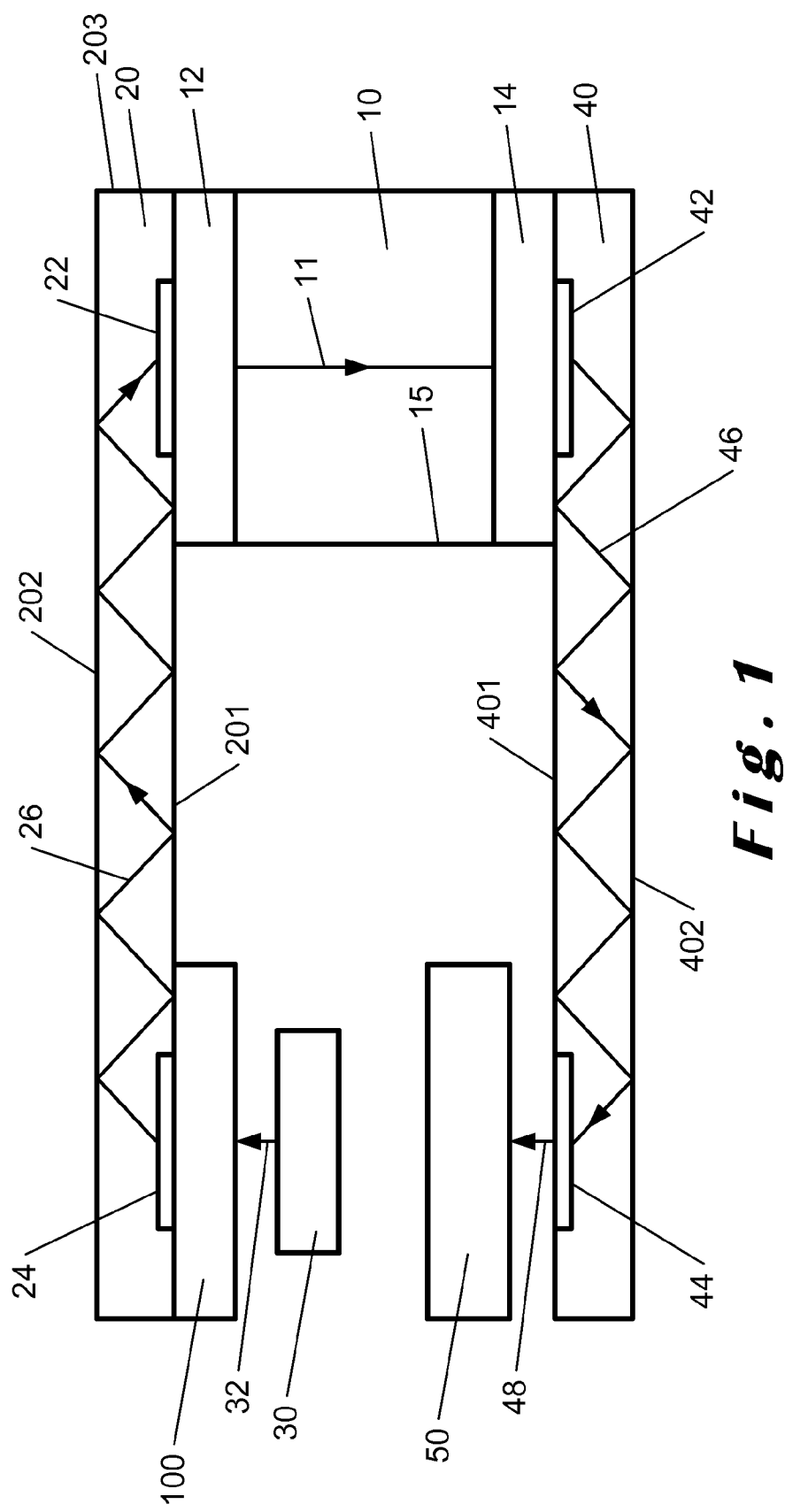
FIG. 1 illustrates an atomic clock comprising a first optical waveguide and a second waveguide comprising a photo detector.

A preferred embodiment of the atomic clock is illustrated in FIG. 1. It comprises a first optical waveguide 20 and a second optical waveguide 40 arranged respectively to a first optical window 12 and a second optical window 14 of the vapor cell 10 of the atomic clock 1.

Said vapor cell 10 is a cavity, preferably realized in a substrate arranged to contain a reactive element such as Cesium or Rubidium. Other reactive gases are possible as well. Preferably said vapor cell 10 is made by MEMS techniques and the atomic clock 1 may be designed as a double resonance atomic clock 1 or a CPT clock 1 or may be designed to use another standard referencing technique. Methods to realize a vapor cell 10 using MEMS technologies are well known and will not be described further. One may refer for example to the following publications cited herewith in their integrity, incorporated by reference:

M. N. Kwakernaak, "Components for batch-fabricated chip-scale atomic clocks", 36th annual Prices Time and Time Interval (PTTI) Meeting, p. 355-368, 2004.

S. Knappe et al. "Atomic vapor cells for miniature frequency references", proceedings of the 2003 IEEE International Frequency Control Symposium, p. 31-32, 2003

V. Venkatraman et al., "Micro fabricated Chips-scale Rubidium Plasma Light Source for Miniature Atomic Clocks", IEEE transactions on Ultrasonics, ferroelectrics and Frequency control 59, 3, p. 448-456, 2012

M. Pellaton et al. "Study of laser-pumped double resonance clock signals using a micro fabricated cell", Physica Scripta, T149, 014013, 2012

Y. Pétremand et al., "Micro fabricated rubidium vapor cell with a thick glass core for small-scale atomic clock applications", J. Micromech. Microeng., 22, 025013, p. 1-8, 2012.

Figure 5:
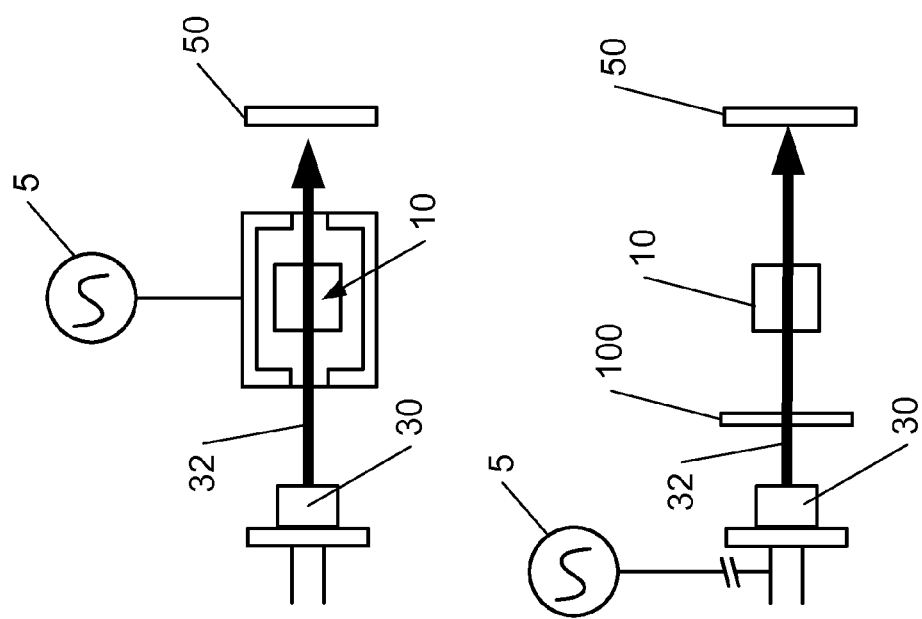
FIG. 5 illustrates a DR atomic clock and a CPT atomic clock.

The atomic clock of the invention may be adapted to double resonance (DR) technique clocks or CPT clocks or any other miniaturized atomic clock using another technique. As illustration, the block diagram of FIG. 5 illustrates the principle of a DR and a CPT clock, including a light source 30, an electric modulator 5, a vapor cell 10 and a photodetector 50, which is well known in prior art.

In the preferred embodiment of the invention the vapor cell 10 comprises a first optical window 12 and a second optical window 14. The first optical window 12 defines the reference plane of the atomic clock 1. The first optical window 12 and a second optical window 14 are linked by a wall 15. Said first optical window 12, second optical window 14 and said wall 15 define the vapor cell 10, arranged to contain a vapor, typically but not limited to, an alkali metal vapor such as Cesium or Rubidium. Said first optical window 12, second optical window 14 and said wall 15 may have any geometry, preferably a geometry defining a cylindrical vapor cell 10. Preferably said first optical window 12 and said second optical window 14 have a circular cross section, defined in the plane of said first 12 and second 14 optical windows, said circular cross section having a radius preferably smaller than 10 mm, more preferably smaller than 2 mm. Alternatively said cross section may be a rectangular shaped cross section. The wall height, defined as the distance between the center of said first optical window 12 and said second optical window 14 is smaller than 15 mm, preferably smaller than 10 mm, more preferably smaller than 5 mm. Said first optical window 12 and said second optical window 14 may have a different geometry and different dimensions.

The vapor cell 10 may comprise at least one opening, in said wall 15, arranged to introduce the alkali vapor provided by a second gas chamber linked to said vapor cell 10. The vapor cell 10 may be a sealed vapor cell 10 wherein said first optical window 12 or said second optical window 14 are optical windows made of a transparent material, such as, but not limited to, glass, fused silica, sapphire, and may be bonded or glued to said vapor cell. Said first optical window 12 or said second optical window 14 may be a silicon optical window. Said first optical window 12 or said second optical window 14 may be an aperture. In a variant, said aperture is realized during an etch process in the case for example of a vapor cell 10 realized by a MEMS process. MEMS processes are well known to the man skilled in the art.

The atomic vapor cell 10 may be realized in glass by using techniques such as glass blowing techniques.

Figure 2A:
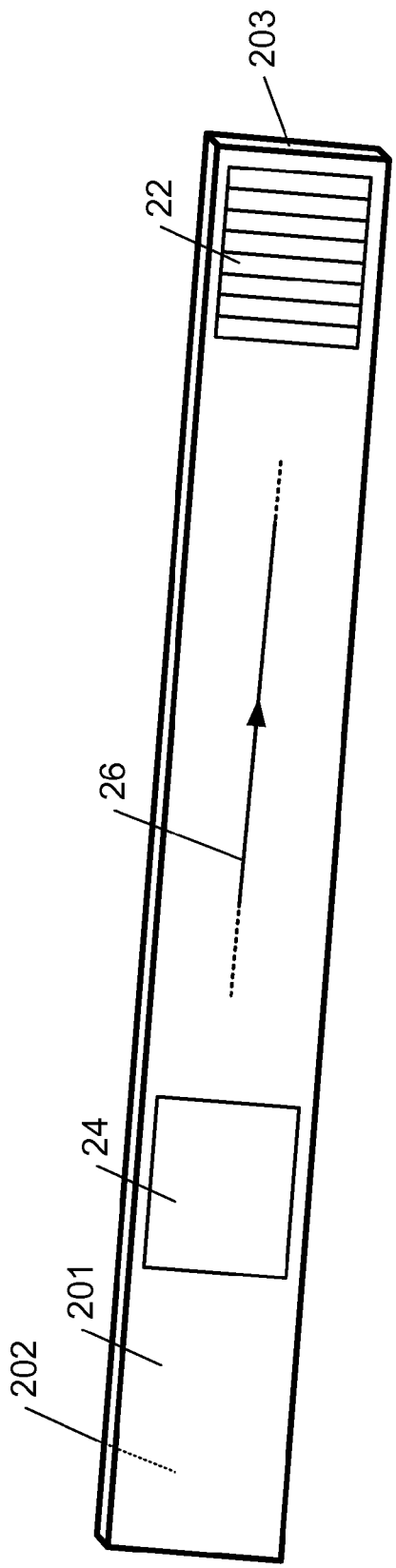
FIG. 2 illustrates a first optical waveguide.

Said first optical waveguide 20 of the preferred embodiment shown in FIG. 1 is illustrated in FIG. 2a and comprises a first incoupling surface 24 and a first outcoupler 22. The first optical waveguide 20 is substantially a flat optical waveguide, preferably a highly multimode waveguide, defined by a first surface 201 and a second surface 202, substantially parallel to said first surface 201 and by a first edge 203 and a second edge at the longitudinal extremities of the first optical waveguide 20. The first optical waveguide 20 may have a trapezoidal shape, which may be useful to improve the expansion of the first guided light beam 26. Such a trapezoidal shape may be realized for example by injection molding techniques. A light source 30, preferably a coherent light source such as a monochromatic light source or a laser 30, more preferably a VCSEL laser 30, providing a linearly polarized light beam, is arranged to said first incoupling surface 24, defined as a portion of the first surface 201 of said first optical waveguide 20 through which light is incoupled into the first optical waveguide 20, defining a first guided light beam 26. In the preferred embodiment of FIG. 1, a quarter-wave plate 100 is arranged between said laser and said first optical waveguide 20, providing an optical beam 32 having a circular polarization. In a variant the light source 30 is not polarized, preferably an alkali discharge lamp, and a linear polarizer may be arranged to said light source 30 to provide a linear polarized light beam 32.

The first incoupling surface 24 may comprise a diffraction grating to couple at least a fraction of said optical beam 32 into said first optical waveguide 20. The incoupling of said optical beam 32 may also be realized with discrete micro-optical elements, preferably a prism coupler adapted to said first optical waveguide 20. Other micro-optical elements may be used as well to incouple said optical beam 32, such as a micro lens array, a micro prism array or a holographic element. Said first incoupling surface 24 may be a wedged surface portion of said first optical waveguide, preferably a portion of said first surface 201.

Said first optical waveguide 20 comprises further a first outcoupler 22. Said first optical waveguide is arranged to said vapor cell so that said first outcoupler 22 faces said first optical window 12. Said first outcoupler 22 is positioned on said first optical waveguide 20 at a distance D from said incoupling surface 24 so that said first guided light beam 26 undergoes at least three internal reflections in said first optical waveguide 20. Said internal reflections are preferably total reflections. The distance D can be chosen so that the expansion of the first guided light beam 26 achieves a beam cross section that is smaller or greater, or preferably substantially equal than the cross section of said first optical window 12, defined in the plane of said first optical window, said beam cross section being defined as the cross section of the first guided light beam 26 at the location of said outcoupler 22 facing said first optical window 12. Said first outcoupler 22 outcouples at least a portion of said first guided light beam 26 out of said first guided waveguide 20, said portion providing a first outcoupled light beam 23 that is directed through said first optical window 12 and subsequently in said vapor cell 10.

For clarity, in all the described embodiments, a first outcoupled light beam 23 is defined as the light beam provided by said first optical waveguide 20 and incident on said first optical window 12 of said vapor cell 10 and a second outcoupled light beam 27 is defined as a light beam exiting said second optical window 14 or exiting said first optical window 12 in the case of an embodiment including a double path of the transmitted light beam 11 in the vapor cell 10 as further described.

In a variant said first outcoupler 22 may be designed and arranged so that said first outcoupled light beam 23 has a cross section smaller than the cross section of said first optical window 12. In another variant said first outcoupler 22 may be designed and arranged so that said first outcoupled light beam 23 has a section substantially equal to the cross section of said first optical window 12.

Figure 2B:
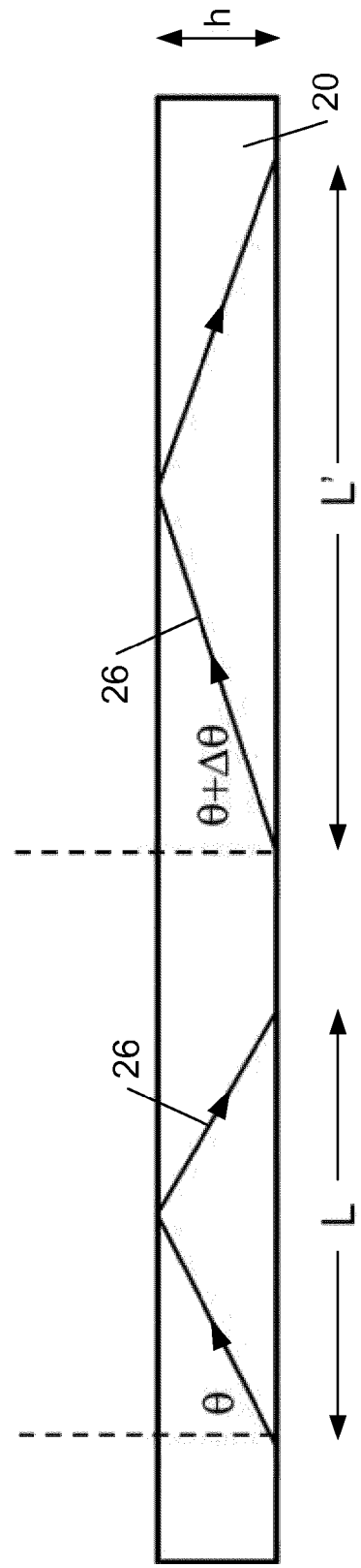
Figure 4:
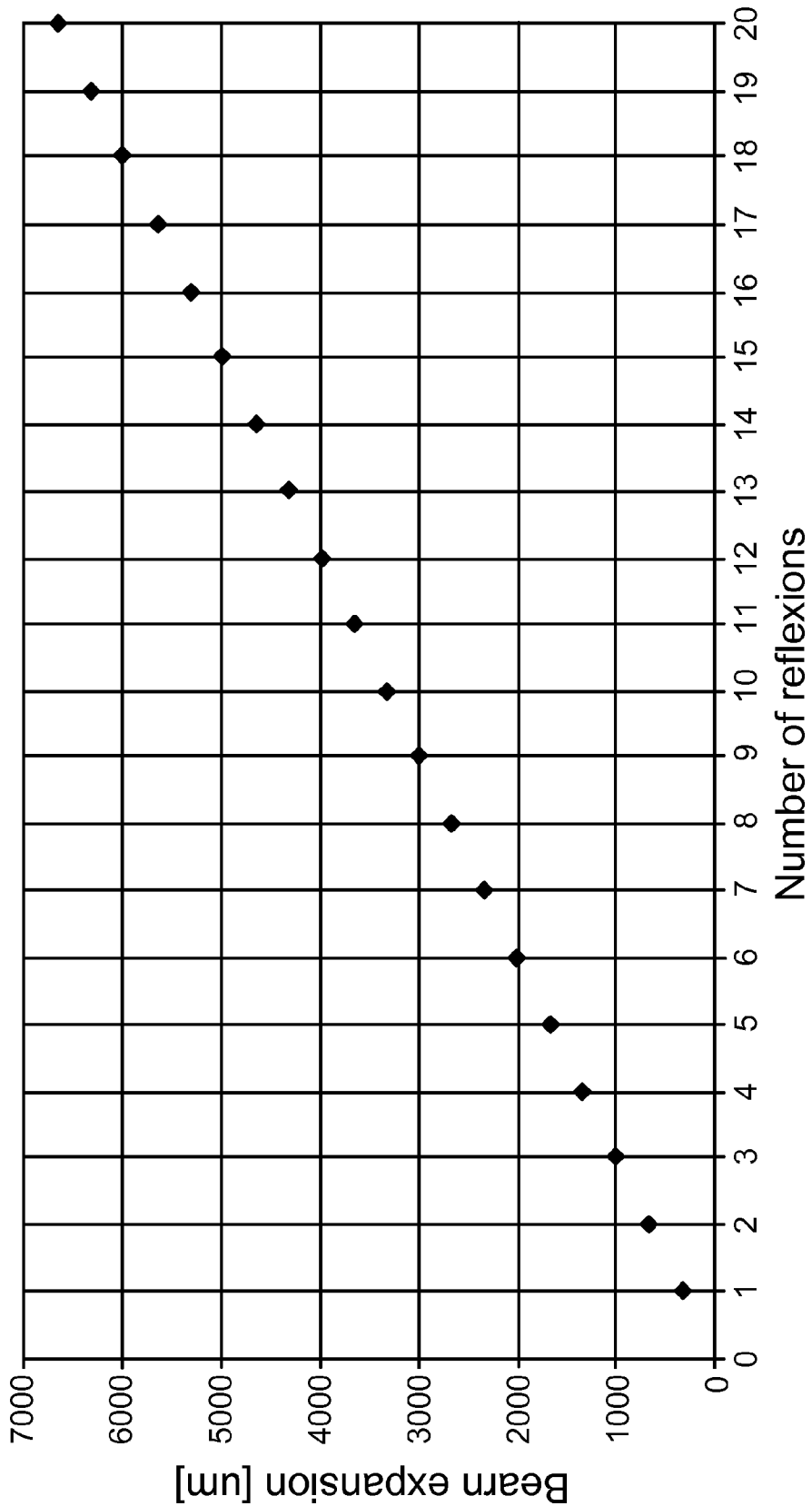
FIG. 4 shows a graph illustrating the expansion of a first guided light beam in a first optical waveguide.

FIG. 2b illustrates the principle of the beam expansion (L-L') in an optical waveguide. If $\theta$ is the internal reflection angle of the first guided light beam 26 and $\Delta\theta$ its angular dispersion, if h is the height of the optical waveguide and N the number of internal reflections, then the expansion of the beam after N internal reflections is given by: $L-L'=Nh[\tan(\theta+\Delta\theta)-\tan(\theta)]$.

FIG. 3a and FIG. 3b illustrates the progression and beam expansion of a first guided light beam 26, provided by the incoupling of an optical beam 32 emitted by a light source 30. In the example of FIGS. 3a, 3b the first extreme ray and the second extreme ray of said optical beam 32 have an angle of +7 degrees respectively −7 degrees relative to the normal to said first surface 201 of the optical waveguide. The ray illustrated by the plain line in FIG. 3a and FIG. 3b shows the progression by multiple reflections of said first extreme ray while the dashed line shows the progression of said second extreme ray. Said reflections are preferably total reflections. The expansion of the beam in the propagation direction in the first optical waveguide 20 is proportional to the waveguide thickness as well as to the number of total reflections. The total reflections of the rays of said first guided beam 26 therefore enable to realize the expansion of said first guided beam 26 into said first optical waveguide 20 using a thin waveguide, enabling the miniaturization of the atomic clock 1 and reducing the number of discrete optical components to be used. Additionally, the transport of a light beam in a shallow waveguide allows to connect optically a light source or a photo detector to the gas cell without stacking these components on top of each other and this allows to reduce the thickness of the assembled system. A diffraction grating incoupler arranged to said incoupling surface 24 may be designed to increase the angular aperture of the incoupled guided light beam 26. As an example, a grating having a period of 740 nm, coupling into said first optical waveguide 20 a laser optical beam 32 having a wavelength of 795 nm, said optical waveguide 20 having a refractive index of 1.4534 (for example in the case of quartz) will widen the optical beam aperture of 14° to an aperture of 14.5° when incoupled in the first optical waveguide 20. FIG. 3a shows the beam expansion in the case of a 14° laser beam aperture and a first optical waveguide 20 having a thickness of 500 µm. FIG. 3b shows a similar expansion for a first optical waveguide 20 having a thickness of 200 µm. Fig. shows the evolution of the beam diameter of the first guided light beam 26 in function of the number of reflections in a first optical waveguide 20 having a thickness of 500 µm.

Said first optical waveguide 20 and said first outcoupler 22 are designed and arranged so that said first outcoupled beam 23 has a substantial circular polarization. Said first outcoupler 22 may be a grating outcoupler 22 designed and arranged to shape said first outcoupled beam 23 and as such improve the adaptation of the first outcoupled beam 23 to the vapor cell 10 geometry, improving as such the signal-to-noise ratio of the atomic device.

Figure 6:
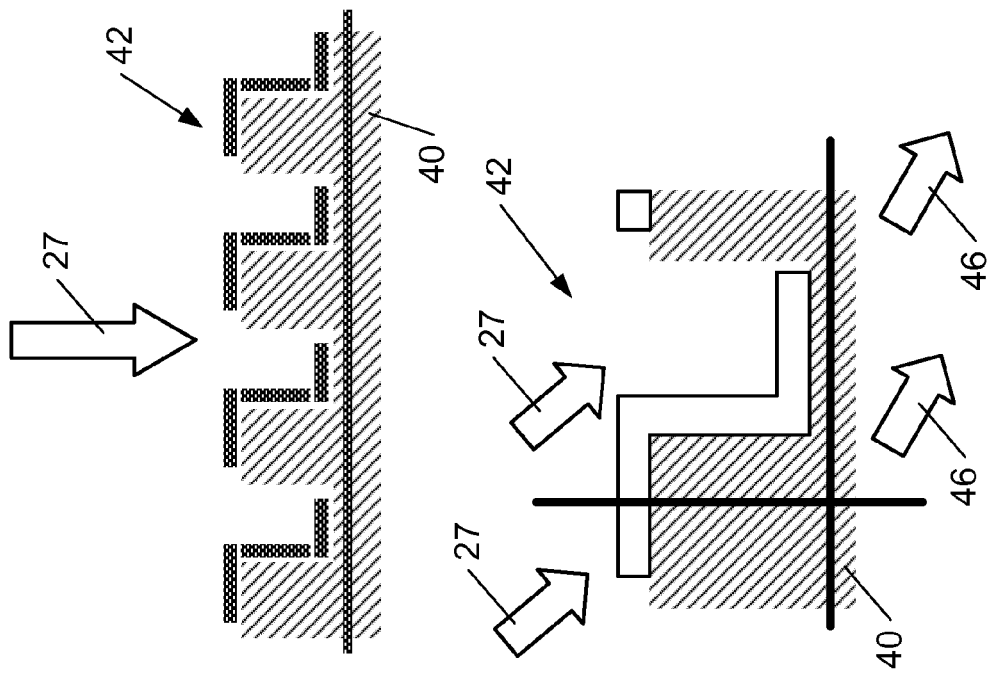
FIG. 6 illustrates a nanostructured grating comprising an asymmetric coating arranged to provide a high efficiency diffraction in a preferred order.

An example of a preferred realization of a specific designed diffraction grating is described in the application PCT/EP2013/072659 and is illustrated in FIG. 6. The grating outcoupler 22 described in PCT/EP2013/072659 is a nanostructured grating comprising an asymmetric dielectric coating and allows to enhance the coupling efficiency in a preferred direction. The use of this type of grating coupler as the first outcoupler 22 may reduce the power consumption of the atomic clock 1 related to the high efficiency of such a grating coupler. The exemplary high efficiency grating couplers 22 described in the application PCT/EP2013/072659 comprise a diffraction grating comprising diffraction grating elements on which an asymmetrical dielectric coating is arranged, allowing to realize and replicate such optical couplers also at very low cost. Coupling efficiencies higher than 50% may be achieved for a specific positive or negative diffraction order, preferably the first or the second diffraction order, with the exemplary grating coupler 22 described in the application PCT/EP2013/072659. High coupling efficiency may be achieved by such asymmetrically coated gratings over a wide wavelength range. The asymmetric dielectric coating is arranged asymmetrically on each of the diffraction grating elements of the outcoupler 22 preferably to the side of the incident light beam 26. The material of said asymmetric dielectric coating is preferably chosen among materials having an index of refraction higher than 1.4 for wavelengths between 0.2 µm and 2 µm, and are preferably chosen among the following materials: ZnS, or TiO2, or HfO2, or Ta2O5, or ZrO2, or AlN, or Al2O3 or ZnO, or SiO2, or Si3N4, or MgF2, or CaF2, or MgO or any combination of these. The asymmetric coating may comprise a first coating portion and a second coating portion. One of said coating portions may be a dielectric and the other portion may be a metal or a semiconductor, and both said coating portions may have a different geometry. The asymmetric dielectric coating may be a multilayer dielectric coating. In a variant of the asymmetrically coated outcoupler 22, at least a first asymmetric dielectric, metallic or semiconductor coating may be arranged to a first side of the diffraction grating elements and at least a second asymmetric coating, comprising a different material than said first asymmetric coating, may be arranged to the second side of the diffraction grating elements.

The exemplary grating outcoupler 22 comprising said asymmetric dielectric coating may be used in all embodiments of the invention and allow to couple light into or out of the first 20 and/or second 40 optical waveguides with an efficiency substantially higher than 50% into either the positive first diffraction order or the negative diffraction order even at perpendicular incidence ($\alpha=0°$). If light is coupled by the exemplary grating coupler 1 with high efficiency into the first positive diffraction order, the coupled light into the corresponding negative diffraction order will be low and vice versa. For example, if light is coupled with an efficiency higher than 70% into the positive first diffraction order, the coupled light into the negative diffraction order will be substantially lower than 30%. The same applies for an arrangement in which light has to be coupled with great efficiency into one of the second diffraction orders, or any other of the positive or negative diffraction orders.

Said first outcoupled light beam 23 provided by said first outcoupler 22 traverses said first optical window 12 and provides a transmitted light beam 11 in the vapor cell 10, said transmitted light beam 11 being transferred to said second optical window 14, said second optical window 14 providing a second outcoupled light beam 27. Said second outcoupled light beam 27 has a substantial circular polarization state, which is achieved by choosing or designing said first optical window 12 and said second optical window 14, as known by a skilled person, so that the circular polarized state of said second outcoupled light beam 27 is substantially the same as the circular polarized state of the first outcoupled light beam 23 before entering said first optical window 12. In particular, if the first optical window 12 or second optical window 14 are chosen to be an aperture, said circular polarized state will de facto not be altered, and if said first optical window 12 or second optical window 14 is a window made of a birefringent transparent material, the main birefringence axes of said first optical window 12 or second optical window 14 will be oriented so that said circular polarized state is not altered and providing as such a circularly polarized transmitted beam 27.

In the preferred embodiment of FIG. 1, said second optical waveguide 40 has a substantially flat shape, similar as the one described of said first optical waveguide 20 and is preferably a highly multimode waveguide. Said second optical waveguide comprises a third surface 401 and a fourth surface 403, said fourth surface being parallel to said third surface 401. In a variant, the geometry of said first optical waveguide 20 and said second optical waveguide 40 may be different. Said second optical waveguide 40 may be arranged parallel to said first optical waveguide 20. Said second optical waveguide 40 and said first optical waveguide 20 may be non-parallel and have an angle defined in said reference plane of the atomic clock.

Said second optical waveguide 40 comprises a first incoupler 42, facing said second optical window 14, said first incoupler 24 being defined as an incoupling structure 24 arranged to said second optical waveguide 40 to incouple into the second optical waveguide 40 at least a fraction of said second outcoupled light beam 27. Said fraction 46, defined also as the second guided light beam 46, is preferably higher than 90%, defined by the ratio of the intensities of said fraction 46 and said second outcoupled light beam 27. Said first incoupler 42 may have a similar structure as said first outcoupler 22 but may also be different. Said first incoupler 42 may be a grating incoupler but may also be a holographic structure or an array of micro-optical elements such as an array of micro lenses or an array of micro prisms, or a combination of them.

It should be clear that, in all the embodiments of the invention, the incouplers or outcouplers are not necessarily limited to gratings, holograms or discrete micro-optical structures. An incoupler may be any structure or layer that allows to incouple a light beam into an optical waveguide. An outcoupler may be any structure or layer that allows to outcouple light from an optical waveguide. For example, said first incoupler 42 or first outcoupler 22 may be realized on the surface of the first optical waveguide 20 or the second optical waveguide 40 but may also be a thin optical element adapted to these surfaces, the term "thin" being defined as having a thickness substantially smaller than the thickness of the first 20 or second 40 optical waveguide, preferably smaller than 5 times the thickness of the optical waveguide to which said incoupler or outcoupler is adapted. An outcoupler 22 and/or an incoupler 42 may be realized by using advanced optical techniques such as performed by surface structures that may realize phonon-photon interactions. Also, the first optical waveguide 20 and/or the second optical waveguide may comprise inside the waveguide, and arranged to said first outcoupler 22 and/or said first incoupler, imbedded structures that allow to deviate said first guided light beam 26 and/or said second guided light beam 46. Said first outcoupler 22 may be a portion of said first surface 201, and said first incoupler 42 may be a portion of said third surface 401.

In the preferred embodiment of FIG. 1 said first incoupler 42 provides a second guided light beam 46 to said second optical waveguide 40. Said second optical waveguide 40 comprises further a first outcoupling surface 44. Said first outcoupling surface 44 is defined as a portion of one of the surfaces 401 of said second optical waveguide 20 through which at least a part of said second guided light beam is outcoupled out of the second optical waveguide 40, defining an atomic signal optical beam 48, also defined as second outcoupled light beam. The first outcoupling surface 44 may comprise a diffraction grating to outcouple out of said atomic signal optical beam 48 under a predetermined angle relative to the normal to said third surface 401. The outcoupling of a part of said second guided light beam 46 may also be realized with discrete micro-optical elements, preferably a prism coupler adapted to said first outcoupling surface. Other micro-optical elements may be used as well to outcouple said second guided light beam 46, such as a micro lens array, a micro prism array or a holographic element. Said first outcoupling surface 44 may be a wedged surface relative to one of the surfaces 401 or 402 of said second optical waveguide 40.

A photo detector 50 is arranged in the atomic clock 1 and is facing said first outcoupling surface 44, and detects said atomic signal optical beam 48 and converts the atomic signal optical beam 48 into an electrical signal that is processed by an electronic circuit, said electrical signal being defined as a driving signal is fed into an electronic circuit that drives said light source 30. Said electronic circuit, which is needed to drive said t light source 30 is well known to a person skilled in the art of atomic clocks and will not further be described here.

In an embodiment shown in FIG. 7 said first incoupling surface 24 comprises an incoupling grating arranged to split the incoupled light beam 26 into two propagating parts, a first propagating part progressing towards the vapor cell 10 and a second propagating part diverted in the opposite direction providing an opposite light beam. A second outcoupling surface 28 is arranged to outcouple at least a fraction of said second propagating part, providing a reference optical beam 29 to a reference detector 60. In all embodiments of the invention the reference detector 60 is associated and is optically cooperating with an outcoupling surface facing said reference detector 60, the light source 30 is associated and optically cooperating with an incoupling surface.

The reference detector 60 provides an electrical signal which allows to make corrections to the detected signals of the atomic clock 1. This may for example improve the long term frequency stability of the atomic clock 1, as corrections may be made for the variations in the intensity of the emitted light beam or to correct drift in the atomic clock signals due to variations with time of the incoupling efficiency of the optical beam 32 into the first optical waveguide 20.

In a variant the vapor cell 10 is arranged to one extremity of said first surface 201. In another variant the vapor cell 10 is arranged to a middle section, defined in the length of said first surface 201, and the light source 30 and the reference detector 60 may be arranged to said first optical waveguide 20, each to an opposite side of the vapor cell 10. In a further variant the reference detector 60 may be arranged between the light source 30 and the vapor cell 10. The invention is not limited to the use of a single reference detector 60 and several, possibly different, reference detectors may be arranged to said first optical waveguide 20 and/or said second optical waveguide 40. In a variant, at least two photo detectors may be arranged in the atomic clock. In a variant of the embodiment of FIG. 1 said two photo detectors are arranged to said second optical waveguide 40, one of said photo detectors facing said first outcoupling surface 44 and the second of said photo detectors facing a further outcoupling surface.

In an embodiment, similar to the embodiment of FIG. 1, and illustrated in FIG. 8, a quarter-wave plate 100 is arranged between said first outcoupler 22 and said first optical window 12. In this embodiment the first optical waveguide 20 transmits a linear polarized first guided light beam 26 and does not need to conserve a circular polarization state. In a variant the first optical window 12 may be a quarter-wave plate, which may be realized by for example a quartz first optical waveguide 20.

In an embodiment, similar to the embodiments of FIG. 7, and illustrated in FIG. 9a a quarter-wave plate 100 is arranged between said first outcoupler 22 and said first optical window 12. In that case the first optical waveguide transmits a linear polarized first guided light beam 26 and does not need to conserve a circular polarization state. In a variant the first optical window 12 may be a quarter-wave plate. In a variant said first guided light beam may be a non-polarized light beam and a linear polarizer may be adapted between said first outcoupler 22 and said quarter-wave-plate 100.

FIG. 9b illustrates an exemplary realization of the embodiment of FIG. 9a. In FIG. 9b a VCSEL laser 30 is arranged to a first PCB layer on which said first optical waveguide 20 is arranged. Said first PCB layer 1a is structured and comprises a quarter-wave plate 100 and a first optical window 12. A second PCB layer 1b is structured and comprises the vapor cell 10, a second optical window 14, a reference detector 60, a photo detector 50 and an ASIC 61. Said second PCB layer 1b comprises the needed electrical connections between the elements of the atomic clock (1). In the exemplary realization of FIG. 9b a third PCB layer 1c is arranged to said second PCB layer 1b. In the exemplary realization of FIG. 9b the thickness of said first optical waveguide 20 is 0.2 mm and the thickness of the atomic clock 1 is smaller than 3 mm and its length l is 7 mm.

In a variant of the embodiment shown in FIG. 9*a* or FIG. 9*b*, the light source 30 and the reference detector 60 may be arranged on said first optical waveguide 20 to each side of the vapor cell 10.

In an embodiment illustrated in FIG. 10 a photo detector 50 is arranged to said second optical window 14. Said photo detector 50 may be for example arranged to a glass optical window 14 or may be arranged to an aperture 14, in case said second optical window 14 is an aperture. For example, said photo detector 50 may be bonded to the rim of said second aperture 14. In a variant of the embodiment of FIG. 10 a quarter-wave plate 100 may be arranged to said light source 30 and in another variant said quarter-wave plate 100 may be arranged between said first optical waveguide 20 and said first optical window 12. In a variant of the embodiment of FIG. 10, illustrated in FIG. 11 and similar to the embodiment of FIG. 7, said first optical waveguide 20 may comprise a reference detector 60. In different variants of the embodiment of FIG. 10 and FIG. 11 said light source 30 and said reference detector 60 may be arranged at different positions along said first optical waveguide 20.

Figure 12:
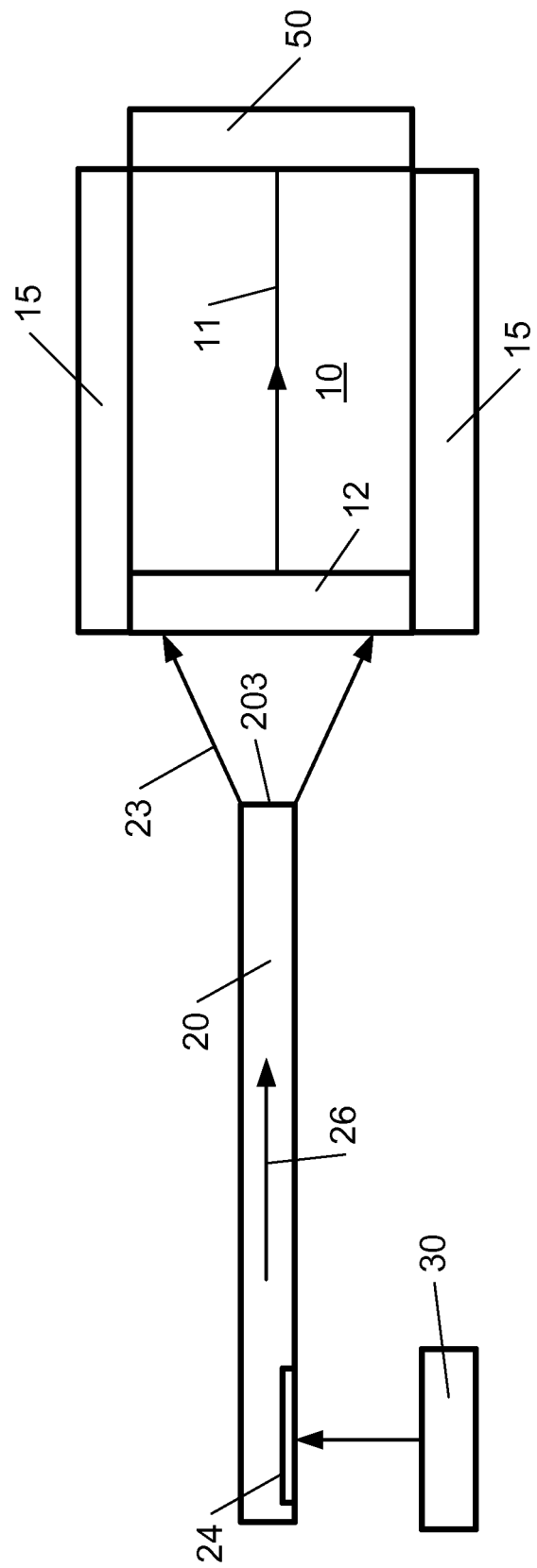
FIG. 12 illustrates an atomic clock comprising a first optical waveguide wherein a light beam exits the first optical waveguide by an edge of that first optical waveguide.

In another embodiment illustrated in FIG. 12, said first outcoupler 22 is arranged to a first edge 203 of the first optical waveguide 20. In a variant said first edge 203 is the first outcoupler 22 and said first guided light beam 26 exits the first optical waveguide 20 through said first edge 203. The first outcoupled light beam 23 provided by said first edge 203 may be shaped by a grating outcoupler 22. Said grating outcoupler 22 may be arranged at a distance from said edge 203. This distance may be preferably 10 mm, more preferably 5 mm, more preferably smaller than 3 mm. In a preferred arrangement said first outcoupled light beam 23 is transformed into a collimated light beam at the position of said first optical window 12. There are different ways to make a collimated beam and this is well known to a person skilled in the art. For example, said first optical window 12 may comprise a beam shaping diffraction grating. In the embodiment of FIG. 12 a photo detector 50 is arranged, similar to FIG. 11, to said second optical window 14, and the wall 15 of said vapor cell 10 comprises at least a portion of its surface which is reflecting for visible and near-infrared light, said visible light being defined as light having a wavelength between 380 nm and 700 nm, excluding 700 nm, and said near-infrared light being defined as light having a wavelength between 700 nm and 1.6 µm. In a variant, the whole surface of the wall 15 is a reflecting surface. Said reflecting surface may be a dielectric surface or a metallic surface, for example a surface made of copper (Cu).

Figure 13:
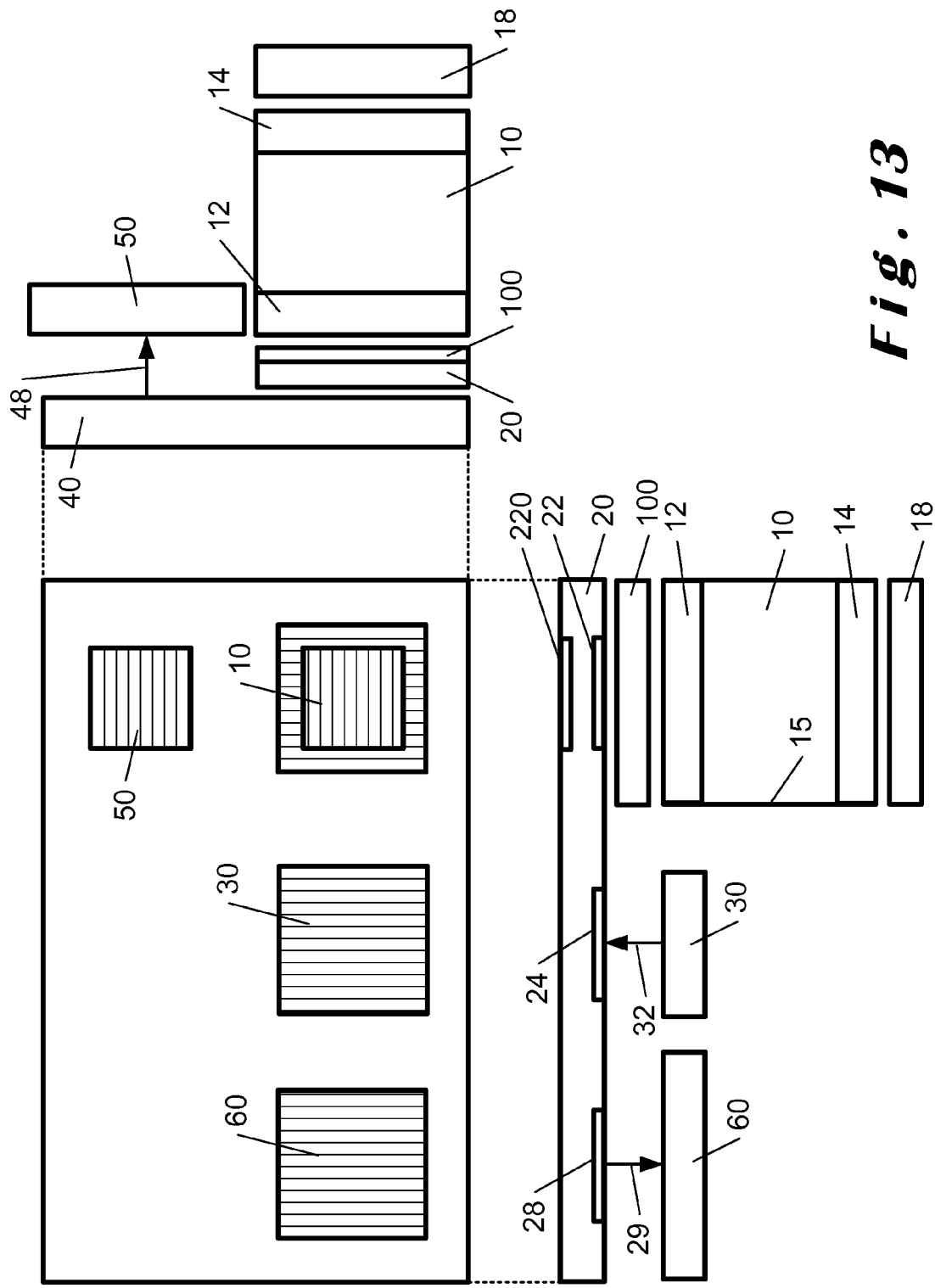
FIG. 13 illustrates an atomic clock arranged to assure a double optical path in the vapor cell.

In another embodiment illustrated in FIG. 13 a quarter-wave plate 100 is arranged between said first outcoupler 22 and said first optical window 12 and a mirror 18 is arranged to said second optical window. The mirror 18 reflects at least a portion of said transmitted light beam 11. Said portion is transmitted through said first optical window 12 and providing a circular polarized second outcoupled light beam 27 to the quarter-wave plate 100, this circular polarization having a sense opposite to the sense of the circular polarization of said transmitted light beam 11. Said quarter-wave plate 100 provides to said first optical waveguide 20 a linear polarized light beam 72 having a polarization direction perpendicular to the linear polarization direction of said first outcoupled light beam 23. Said first outcoupler 22 is designed and arranged to transmit said linear polarized light beam 72 to said second surface 202 of said first optical waveguide 20. Facing said quarter wave plate 100, a third outcoupling surface 220, facing said first coupler 22, is arranged to said second face 202. This third outcoupling surface 220 may be a portion of said second face 202. As the direction of said linear polarized light beam 72 is parallel to the normal of said second face 202, a fraction of said linear polarized light beam 72 is outcoupled out of said first optical waveguide 20. In an exemplary variant, in order to improve the outcoupling efficiency of said third outcoupling surface 220, a diffraction grating may be arranged to said third outcoupling surface 220. This diffraction grating arranged on said third outcoupling surface 220 may be designed and a realized so that the direction of the outcoupled fraction of said linear polarized light beam 72 has an angle relative to the normal to said second face 202. In the embodiment of FIG. 13 a second optical waveguide 40 is further arranged to said first optical waveguide 20. Said second optical waveguide 40 comprises a first incoupler 24, facing said quarter wave plate 100 and said third outcoupling surface 220, and provides a second guided light beam propagating in said second optical waveguide 40. Said second optical waveguide 40 comprises, similar to the embodiment of FIG. 1 a first outcoupling surface 44 and a photo detector 50. Said second optical waveguide 40 and said first optical waveguide 20 may be parallel or may be arranged perpendicular to each other or may be arranged with an angle defined in said reference plane of the atomic clock 1.

It is understood that in all embodiments of the invention the photo detector 50 or the light source 30 or the reference detector 60 may be arranged to any side of said first and second optical waveguide. The most compact atomic clock 1 is obtained when the photo detector 50, the light source and the reference detector 60 are arranged in the space defined between said first optical waveguide 20 and said second optical waveguide 40.

Figure 14:
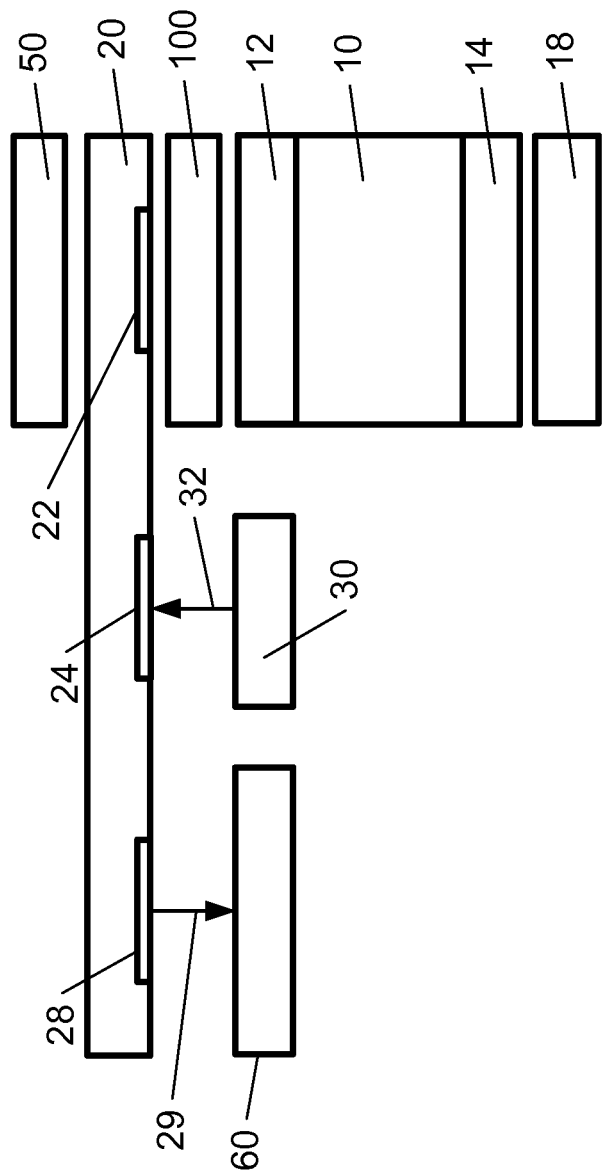
FIG. 14 illustrates another variant of an atomic clock arranged to assure a double optical path in the vapor cell.

In an embodiment illustrated in FIG. 14, a photo detector 50 is arranged to said third outcoupling surface 220. The difference with the embodiment of FIG. 13 is that the second optical waveguide 40 is replaced by said photo detector 50.

It is understood that the optical waveguides of the invention may be realized in a large variety of materials chosen among glasses, silica, fused quartz or any material transparent in the visible or near infra-red wavelengths.

The first optical waveguide 20 and the second optical waveguides 40 may be arranged to said vapor cell 10 by different methods such as gluing methods, especially using UV-glues, clipping or anodic bonding techniques. The different assembly method can especially optically connect the said optical waveguide to the said vapor cell or its optical window, the waveguide being potentially merged with the optical window.

The first optical waveguide 20 and the second optical waveguides 40 may comprise an adaptation layer allowing to arrange said first optical waveguide 20 and said second optical waveguide 40 to the vapor cell 10. Said adaptation layer may be a multilayer, said multilayer may comprise a glue layer. The atomic clock 1 may also comprise at least one optical waveguide comprising a reflection layer to at least one side of the optical waveguide. For example, a reflection layer may be arranged to at least one of the side surfaces linking said first and said second surface of said first optical waveguide 20.

It is also understood that said first and said second optical waveguide may comprise additional structures or optical micro elements that allow to improve the performance of the atomic cell. For example, further grating structures may be arranged to said first or second optical waveguide in order to improve the polarization state of the guided light beam.

It is also generally understood that in all embodiments of the invention said first optical waveguide 20 may be arranged to the vapor cell 10 in any direction in the reference plane defined by said first optical window 12 and said second optical waveguide 40 may be arranged, in said reference plane of the atomic clock 1, in another orientation than the direction of said first optical waveguide 20. In different variants of the invention said laser 30, said photo detector 50 and said reference detector 60 may be arranged to said first optical waveguide 20 and said second optical waveguide 40 on different locations relative to said vapor cell 10. Said first 20 and said second 40 optical waveguides may be curved optical waveguides, defined in said reference plane of the atomic clock. Said first 20 and said second 40 optical waveguides may be optical waveguides that are bent outside said plane, in as far that the overall thickness of the atomic clock does not exceed 15 mm. An arrangement wherein a first optical waveguide 20 is bent is illustrated in FIG. 15. In such a configuration the thickness t, which is smaller than 15 mm, is defined in the plane of the photodetector 50. As another example, said photo detector 50 and/or said light source 30 and/or said reference detector 60 may be assembled on a chip, said chip being arranged between said first optical waveguide 20 and said second optical waveguide 40, said first optical waveguide 20 and said second optical waveguide 40 being both bent so that the corresponding incoupling surface 24, second outcoupling surface 44 and third outcoupling surface 28 are facing respectively said light source 30, said photo detector 50 and said reference detector 60. In an embodiment said first optical waveguide 20 and/or said second optical waveguide (40) may be wrapped around said vapor cell and may comprise at least one magnetic and/or thermal shielding layer. In an embodiment the vapor cell may be a cylindrical vapor cell 10 and the first optical waveguide 20 and/or the second optical waveguide 40 may be arranged to the cylindrical wall of the vapor cell 10, said cylindrical wall comprising said first optical window 12 and/or said second optical window 14. In a variant the flat side walls of the cylindrical vapor cell may comprise a reflecting surface.

In all the embodiments of the invention said first and/or second optical waveguides may comprise a cladding layer on at least a part of one of its face. An absorbing layer may be arranged on at least a portion of said cladding layer, said absorbing layer avoiding parasitic light to be introduced in said vapor cell 10 or to bring noise to the photodetector 50 or the reference detector 60. Also, in all embodiments of the invention additional grating structures may be arranged on at least one of the surfaces of said first optical waveguide 20 and/or said second optical waveguide 40. Such additional grating structures may be arranged to improve the beam shaping of said first guided light beam 26 or said second guided light beam 46, and/or may be adapted for example to remove unwanted guided modes.

The invention includes also the possible arrangement of optical devices in the atomic clock, more particular optical devices and electrical connections may be adapted to said first 20 or second 40 optical waveguides and that may interact with the optical light beams. For example, at least one acousto-optical modulator generating a surface acoustic wave may be arranged to the first optical waveguide 20 and still assure that the thickness t of the atomic clock is smaller than 15 mm.

The different elements and the design of the atomic clock will be adapted in function of the type of atomic clock. For example, if a magnetic field is present appropriate shielding is arranged in the atomic clock and may be arranged on at least a part of the said first waveguide. In another example, if temperature control of the vapor cell is required, the waveguide may be used to control and regulate the temperature of the vapor cell.

The invention includes also an embodiment in which said first optical waveguide 20 is bent so that a first portion of said first optical waveguide 20 is arranged to said first optical window 12 and a second portion of said first optical waveguide 20 is arranged to said second optical window 14. In a variant of an arrangement including a bent first optical waveguide, a similar bent second optical waveguide 40 may be arranged to said vapor cell.

The invention is not limited to one light source and several light sources may be arranged to said first and/or second optical waveguide. For example, in a variant, a first light source and a first photo detector is arranged to said first optical waveguide and a second light source and a second photo detector is arranged to said second optical waveguide, said first photo detector being arranged to cooperate with said second light source and said second photo detector being arranged to cooperate with said first light source. An array of light sources and/or photo detectors may be used as well.

Also, it is understood that in atomic clocks the arrangements and assembly of the first and second optical waveguides is realized by a technique that assures a hermetic seal of said vapor cell. Techniques to realize a hermetic seal of a vapor cell 10 are not described here as they are well known to the person skilled in the art.

The overall dimensions of the atomic clock may have a wide range as well as their outside shape defined in the pane of the atomic clock. In the plane of the atomic clock the dimension may be 50×50 mm, preferably 20×30 mm, preferable 10×30 mm, more preferably 10×20 mm. The thickness of the atomic clock defined perpendicular to said plane is smaller than 15 mm. The same invention may be applied as well to atomic clock of larger dimension or lower vertical compactness for ease of manufacturing and assembly.

The invention claimed is:

1. An atomic clock comprising at least one light source adapted to provide an optical beam, at least one photo detector and a vapor cell comprising a first optical window, said optical beam being directed through said vapor cell for providing an optical frequency reference signal, said photo detector being adapted to detect said optical frequency reference signal and to generate at least one reference signal, wherein said atomic clock further comprises a first optical waveguide arranged to said first optical window, said first optical waveguide is a linear and substantially flat optical waveguide, defining a first longitudinal surface and a second longitudinal surface parallel to the first surface, and comprising a first edge at one of the longitudinal extremities of the first optical waveguide, said first optical waveguide comprises a first incoupling surface facing said light source and arranged to incouple at least a portion of said optical beam into said first optical waveguide, said portion providing a first guided light beam propagating into said first optical waveguide, said first optical waveguide being sized and shaped so that said first guided light beam undergoes at least three total internal reflections along a longitudinal direction of the first optical waveguide, a first outcoupler that faces said first optical window, arranged to outcouple at least a portion of said guided light beam, providing a first outcoupled light beam that is transmitted to said vapor cell through said first optical window, wherein the first outcoupler and the first incoupling surface are configured on at least one of the first longitudinal surface and the second longitudinal surface, wherein said first incoupling surface and said first outcoupler are separated by a distance D chosen to expand said first guided light beam and to provide said first outcoupled light beam, and wherein the thickness (t) of the atomic clock, defined in the direction of the normal to said first longitudinal surface, is smaller than 15 mm.

2. The atomic clock according to claim 1, wherein said first incoupling surface comprises a first incoupling grating.

3. The atomic clock according to claim 1, wherein said vapor cell comprises a second optical window facing said first optical window.

4. The atomic clock according to claim 3, wherein a second optical waveguide is arranged to said second optical window, said second optical waveguide comprising a first incoupler, said second optical waveguide comprising an first outcoupling surface, said photo detector being arranged to said first outcoupling surface.

5. The atomic clock according to claim 4, wherein said first optical waveguide comprises a second outcoupling surface, said atomic clock comprising a reference detector, said reference detector being arranged to said second outcoupling surface.

6. The atomic clock according to claim 5, wherein said second outcoupling surface and said reference detector are arranged to said first optical waveguide between said light source and said first outcoupler.

7. The atomic clock according to claim 3, wherein said photo detector is arranged to said second optical window.

8. The atomic clock according to claim 7, wherein said first optical waveguide comprises a second outcoupling surface, said atomic clock comprising a reference detector, said reference detector being arranged to said second outcoupling surface.

9. The atomic clock according to claim 8, wherein said second outcoupling surface and said reference detector are arranged to said first optical waveguide between said light and said first outcoupler.

10. The atomic clock according to claim 7, wherein said first outcoupler is arranged to said first edge.

11. The atomic clock according to claim 7, wherein a collimating optical system is arranged to said first optical window.

12. The atomic clock according to claim 11, wherein said collimating optical system comprises a diffraction grating.

13. The atomic clock according to claim 10, wherein a portion of the wall of said vapor cell comprises a reflecting surface.

14. The atomic clock according to claim 1, wherein a quarter-wave plate is arranged between said light source and said first incoupling surface.

15. The atomic clock according to claim 1, wherein a quarter-wave plate is arranged between said first outcoupler and said first optical window.

16. The atomic clock according to claim 3 wherein a mirror is arranged to said second optical window and wherein a quarter-wave plate is arranged between said first outcoupler and said first optical window.

17. The atomic clock according to claim 16 wherein a second optical waveguide is arranged to said first optical waveguide, said second optical waveguide comprising a first incoupler facing said first outcoupler, said second optical waveguide also comprising a first outcoupling surface, said atomic clock comprising a photo detector arranged to said first outcoupling surface.

18. The atomic clock according to claim 16 wherein said first optical waveguide comprises a second outcoupling surface and a reference detector arranged to said second outcoupling surface.

19. The atomic clock according to claim 18 wherein said second outcoupling surface and said reference detector are arranged to said first optical waveguide between said light source and said first outcoupler.

20. The atomic clock according to claim 16, wherein an optical detector is arranged to said first optical waveguide, said optical detector facing said quarter-wave plate to the side of said first optical waveguide away from said quarter-wave plate.

21. The atomic clock according to claim 1, wherein said first optical waveguide comprises a first adaptation layer arranged between said first optical waveguide and said vapor cell.

22. The atomic clock according to claim 3, wherein said second optical waveguide comprises a second adaptation layer arranged between said second optical waveguide and said vapor cell.

23. The atomic clock according to claim 1, wherein said first optical waveguide comprises at least one metalized surface.

24. The atomic clock according to claim 1, wherein said first optical waveguide comprises a cladding layer.

25. The atomic clock according to claim 24, wherein said first optical waveguide comprises an absorption layer.

26. The atomic clock according to claim 3, wherein said second optical waveguide comprises at least one metalized surface.

27. The atomic clock according to claim 3, wherein said second optical waveguide comprises a cladding layer.

28. The atomic clock according to claim 27, wherein said second optical waveguide comprises an absorption layer.

29. The atomic clock according to claim 1, wherein said first outcoupler is a nanostructured grating comprising an asymmetric coating.

30. The atomic clock according to claim 3, wherein said second incoupler is a nanostructured grating comprising an asymmetric coating.

31. The atomic clock according to claim 4, wherein at least two light sources are arranged to said first optical waveguide and/or second optical waveguide.

32. The atomic clock according to claim 4, wherein at least two photo detectors are arranged to said first optical waveguide and/or second optical waveguide.

* * * * *